(12) United States Patent
Endoh et al.

(10) Patent No.: US 9,216,444 B2
(45) Date of Patent: Dec. 22, 2015

(54) REACTOR CLEANING APPARATUS

(75) Inventors: Toshihide Endoh, Suzuka (JP);
Masayuki Tebakari, Saitama (JP);
Toshiyuki Ishii, Yokkaichi (JP);
Masaaki Sakaguchi, Suzuka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 13/067,400

(22) Filed: May 31, 2011

(65) Prior Publication Data

US 2011/0232694 A1 Sep. 29, 2011

Related U.S. Application Data

(62) Division of application No. 12/320,272, filed on Jan. 22, 2009, now Pat. No. 7,975,709.

(30) Foreign Application Priority Data

Jan. 25, 2008 (JP) ................................. 2008-014967

(51) Int. Cl.
*B08B 9/28* (2006.01)
*B08B 3/02* (2006.01)
*B08B 3/04* (2006.01)
(Continued)

(52) U.S. Cl.
CPC ..... *B08B 9/28* (2013.01); *B08B 3/02* (2013.01); *B08B 3/04* (2013.01); *B08B 3/08* (2013.01); *B08B 9/34* (2013.01); *C23C 14/564* (2013.01); *C23C 16/4407* (2013.01)

(58) Field of Classification Search
USPC .................................. 134/167 R, 168 R, 172
See application file for complete search history.

(56) References Cited

U.S. PATENT DOCUMENTS 1,799,525 A 4/1931 Gomar Morgan
1,954,222 A 4/1934 Bennett Olson
(Continued)

FOREIGN PATENT DOCUMENTS

EP 2011897 A2 1/2009
JP 56-114815 * 9/1981
(Continued)

OTHER PUBLICATIONS

European Search Report dated Jun. 10, 2009 for EP Application No. 09151031.3.

(Continued)

*Primary Examiner* — David Cormier
(74) *Attorney, Agent, or Firm* — Locke Lord LLP (57) ABSTRACT

In a reactor cleaning apparatus 1 which cleans an inner wall surface 72 of a reactor 70 which generates polycrystalline silicon, a bell jar of the reactor 70 has a dual structure, a through hole 11 is formed along a vertical direction at a central portion of a substantially disc-like tray 10 placed in a horizontal state, a flange portion 13 in which an opening edge of the reactor 70 is placed is formed at an outer peripheral portion of the tray 10, a shaft 20 is provided through the through hole 11 of the tray 10 so as to be rotatable and movable in the vertical direction, a nozzle device 50 which sprays a cleaning water at high pressure in three-dimensional directions is provided at an upper end of the shaft 20, a drive mechanism 30 which rotates the shaft 20 and moves the shaft in the vertical direction is provided at a base end of the shaft 20, and steam piping 62 capable of supplying the steam within the bell jar of the reactor 70 is provided.

10 Claims, 6 Drawing Sheets

(51) Int. Cl.
  *B08B 3/08* (2006.01)
  *B08B 9/34* (2006.01)
  *C23C 14/56* (2006.01)
  *C23C 16/44* (2006.01)

(56) References Cited

U.S. PATENT DOCUMENTS

| | | | |
|---|---|---|---|
| 3,747,614 A | | 7/1973 | Buedingen |
| 4,366,004 A | * | 12/1982 | Gregor et al. ............... 134/22.11 |
| 4,805,650 A | * | 2/1989 | Yasui et al. ................. 134/57 R |
| 4,859,249 A | | 8/1989 | Valentini |
| 5,267,533 A | * | 12/1993 | Smith ............................ 122/379 |
| 5,640,643 A | | 6/1997 | Hoitz et al. |
| 5,878,966 A | * | 3/1999 | Asakawa et al. ............... 239/590 |
| 6,125,864 A | | 10/2000 | Morikawa et al. |
| 6,148,832 A | | 11/2000 | Gilmer et al. |
| 6,336,239 B1 | | 1/2002 | Cooper |
| 6,926,017 B2 | | 8/2005 | Halbmaier |
| 6,932,094 B2 | | 8/2005 | Chen et al. |
| 8,017,024 B2 | * | 9/2011 | Kim et al. ........................ 216/37 |
| 2004/0000327 A1 | * | 1/2004 | Somboli et al. ................. 134/21 |
| 2004/0178176 A1 | | 9/2004 | Dunn |

FOREIGN PATENT DOCUMENTS

| | | | |
|---|---|---|---|
| JP | 56-114815 A | | 9/1981 |
| JP | 02-145767 | * | 6/1990 |
| JP | 3167191 | | 8/1994 |
| JP | 10-045488 | * | 2/1998 |
| KR | 2020000003449 A | | 2/2000 |

OTHER PUBLICATIONS

Korean Notice of Allowance mailed on Oct. 24, 2014 issued for corresponding Korean Patent Application No. 10-2009-0004988.

* cited by examiner

REACTOR CLEANING APPARATUS

This application is a divisional application of U.S. application Ser. No. 12/320,272, filed Jan. 22, 2009, and claims the right of priority under 35 U.S.C. §119 based on Japanese Patent Application No. 2008-014967 filed Jan. 25, 2008, which is hereby incorporated by reference herein in its entirety as if fully set forth herein.

BACKGROUND OF THE INVENTION

1. Field of the Invention

The present invention relates to a reactor cleaning apparatus which cleans an inner wall surface of a polycrystalline silicon reactor to be used when producing polycrystalline silicon using the Siemens method.

Priority is claimed on Japanese Patent Application No. 2008-014967, filed Jan. 25, 2008, the content of which is incorporated herein by reference.

2. Description of Related Art

The Siemens method is known as a method of producing high-purity polycrystalline silicon to be used as a semiconductor material. This Siemens method is a production method of supplying a source gas which is a mixed gas of chlorosilane and hydrogens into contact with a heated silicon seed rod, and depositing the polycrystalline silicon which is generated by the thermal decomposition and hydrogen reducing reaction of a source gas, on the surface of the seed rod. As an apparatus which carries out this production method, a polycrystalline silicon reactor in which many silicon seed rods are erected is used.

When polycrystalline silicon is produced in this polycrystalline silicon reactor, chlorosilane polymers which are generated as a by-product at the time of the thermal decomposition and hydrogen reducing reaction are condensed and adhered on cooled inner wall surface of the reactor. In order to remove the deposited polycrystalline silicon rods, the reactor has to be opened to the atmosphere. On this occasion, chlorosilane polymer and moisture in the atmosphere undergo hydrolysis, hydrogen chloride is generated. The hydrogen chloride erodes the inner surface of the reactor and deteriorates the working environment, and a contamination source is generated the polycrystalline silicon products. Additionally, in the situation that chlorosilane adheres to the bell jar which is a member of the reaction vessel and a bell-shaped object having lower opening edge, reflectivity of inner wall surface of the reactor decreases, the radiation heat from heated silicon rods is not reflected, and the efficiency in the use of electricity decreases. Therefore, in order to generate effectively the highly-pure polycrystalline silicon, when once a reaction is finished, it is necessary to remove the deposits before the next reaction. Therefore, for example, in Japanese Patent Unexamined Publication No. 56-114815, a method of supplying steam inside a wall of a polycrystalline silicon reactor to heat the inner wall surface of the reactor, introducing an humidified gas into the polycrystalline silicon reactor to hydrolyze chlorosilane polymer adhered to the inner wall surface of the reactor, loading a nozzle into the reactor to spray a high-speed jet stream of the inert gas to the inner wall surface and removing the deposits on the inner wall surface of the reactor is suggested. Additionally, the method of removing the deposits by blasting of $CO_2$ pellets to the inner wall surface of the reactor is described, for example, in Japanese Patent Publication No. 3167191.

SUMMARY OF THE INVENTION

Meanwhile, in the cleaning method described above, it is difficult to spray the high-speed jet stream uniformly throughout the inner wall surface of the reactor having irregularities, and it is impossible to perfectly remove the deposits. Additionally, in the method of using $CO_2$ pellets described Japanese Patent Publication No. 3167191, hydrolysis of the silicon deposits is not proceeded, hydrogen chloride might be generated when the reactor is opened.

The present invention was made in view of such a problem, and an object thereof is to provide a reactor cleaning apparatus capable of easily and reliably removing deposits and cleaning water of an inner wall surface in a polycrystalline silicon reactor.

In order to solve the above problem, the invention suggests the following means.

That is, in the prevent invention, there is provided a apparatus for cleaning an inner surface of a bell jar that has a dual structure in a reactor generating a polycrystalline silicon, a drainage hole is formed in a substantially disc-like tray placed in a horizontal state, a flange portion on which an opening edge of the wall bottom of the reactor is placed is formed at an outer peripheral portion of the tray, a shaft is provided through the through hole of the tray so as to be rotatable and movable in the vertical direction, a nozzle device which sprays a cleaning water at high pressure in three-dimensional directions is provided at an upper end of the shaft, a drive mechanism which rotates the shaft and move the shaft in the vertical direction is provided at the shaft, and steam piping capable of supplying the steam within the bell jar of the reactor is provided between the outer wall and the inner wall.

When the inner wall surface of the reactor is cleaned by this reactor cleaning apparatus, the reactor is placed on the disc-like tray such that the lower opening edge of the reactor abuts on the flange portion of the outer peripheral portion of the tray from the above. Additionally, the shaft having the nozzle device at its upper end is provided at the central portion of the tray in the vertical direction, and the shaft rotates and moves in the vertical direction by the drive mechanism provided at the base end of the shaft. The nozzle device provided at the upper end of the shaft in this way sprays a cleaning water at high pressure in three-dimensional directions, in accordance with up-down movement of the shaft. Since this makes it possible to spray the cleaning water at high pressure in various directions three-dimensionally from an upper portion of the inner wall surface of the reactor to a lower portion thereof, it becomes possible to directly spray the cleaning water uniformly throughout an inner wall surface of the reactor. Additionally, using the cleaning water becomes possible to progress hydrolysis of the deposits and to remove as chemically stable silica.

In addition, although corrosive gas, such as hydrogen chloride, is generated during cleaning, the space inside the reactor is in a substantially sealed state except for the cleaning liquid discharge hole, and the corrosive gas is all discharged to the outside of the system from the discharge hole. Accordingly, the deterioration of the external atmosphere by the hydrogen chloride can be prevented, and the working environment for producing high-quality polycrystalline silicon can be maintained.

Moreover, steam is supplied into the dual structure of the bell jar of the reactor. Thus, a cleaning water which remains inside the reactor after spraying can be evaporated and removed reliably and efficiently, and the inside of the reactor can be kept at a clean level where high-quality polycrystalline silicon can be produced.

Additionally, in the reactor cleaning apparatus according to the present invention, wherein the shaft has a feed screw formed on the outer peripheral portion, the tray is provided with a fixed nut which is screwed to the feed screw and guides the shaft upward and downward in accordance with rotation of the shaft, and the drive mechanism is provided with a pulley to rotate by a power source thereof, and in which the shaft is inserted in a central portion of the pulley and provided with a spline groove and a spline ridge, which allow the shaft and the pulley to fit thereto so as to be slidable in the length direction, between the inner peripheral surface of the pulley and the outer peripheral surface of the shaft.

Since the spline ridge of the shaft which fits to the spline ridge of the pulley, the shaft which fits to the pulley is also rotated when power is transmitted to the pulley by the power source. At this time, since the shaft fits to the pulley so as to be slidable in the length direction of the shaft, the shaft is rotated reliably without losing the transmission of power from the pulley to the shaft even if the feed screw of the shaft is guided by the fixed nut and the shaft moves up and down. Accordingly, since the shaft can be moved up and down while a rotative force is reliably transmitted to the shaft, the nozzle device provided at the upper end of the shaft is able to spray the cleaning water effectively over the upper and lower portions of the inner wall surface of the reactor.

Moreover, in the reactor cleaning apparatus according to the invention, an upper surface of the tray is inclined so as to have a descending gradient toward the drainage hole. Thereby, the cleaning waste liquid which is sprayed to the inner wall surface of the reactor and is accommodated in the tray is easily guided to the drainage hole. Therefore, the cleaning waste liquid can be easily drained after cleaning.

Additionally, according to the method for cleaning an inner surface of a bell jar of the reactor having a dual structure which generates polycrystalline silicon, the method comprising the steps of: providing a lower opening edge of the bell jar on the substantially disc-like tray; rotating and moving the shaft provided in a central portion of the tray in the vertical direction, and cleaning an inner peripheral surface of the bell jar by spraying a cleaning water at high pressure in three-dimensional directions with the nozzle device provided at an upper end of the shaft; draining the wasted cleaning water from the drainage hole formed in the tray; supplying the steam between an outer wall and an inner wall of the bell jar; and drying the inner peripheral surface of the bell jar.

According to the reactor cleaning apparatus related to the invention, the cleaning water can be sprayed at high pressure three-dimensionally in various directions from an upper portion of the inner wall surface of the reactor to a lower portion thereof, and it becomes possible to directly spray the cleaning water uniformly throughout inner wall surface of the reactor. Additionally, since corrosive gas, such as hydrogen chloride is discharged to the outside of the system from the discharge hole, and the cleaning water makes to progress hydrolysis of the deposits and to remove the deposits as chemically stable silica, the treatment of the reactor after the cleaning is safe. In addition, since steam can be supplied into the bell jar of the reactor, remaining cleaning water is can be removed efficiently and reliably.

DETAILED DESCRIPTION OF THE INVENTION

Figure 1:
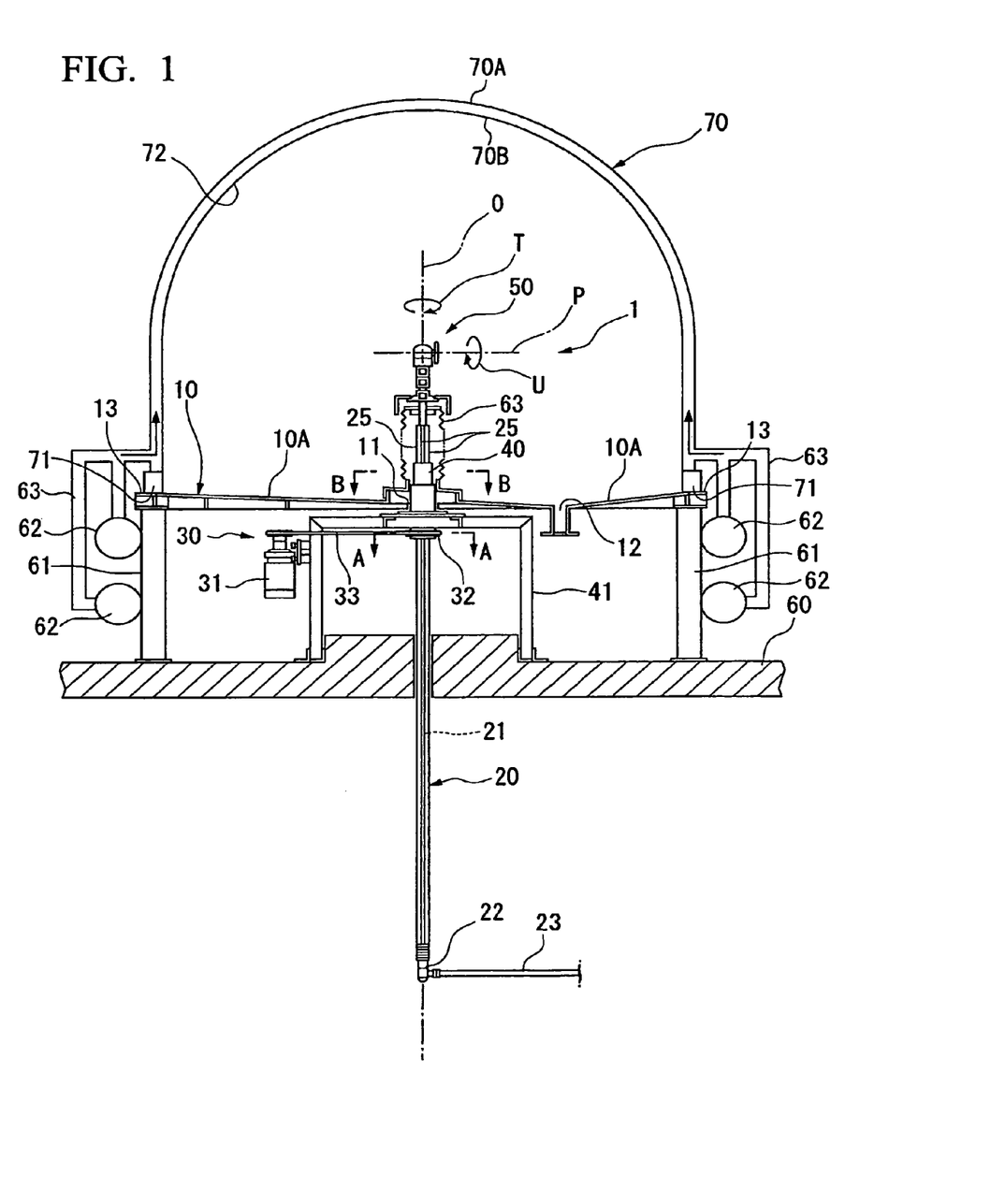
FIG. 1 is a schematic configuration diagram of a reactor cleaning apparatus related to this embodiment.
Figure 2:
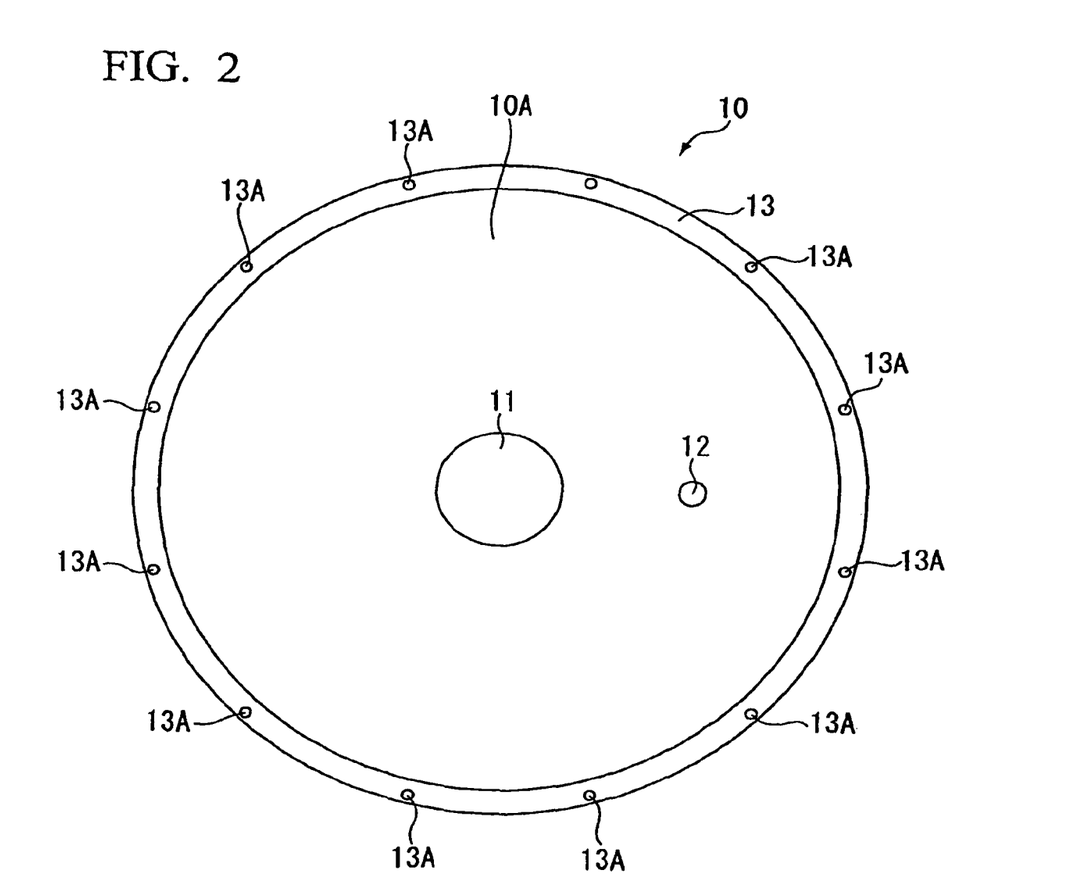
FIG. 2 is a plan view of a tray of the reactor cleaning apparatus related to this embodiment.
Figure 3:
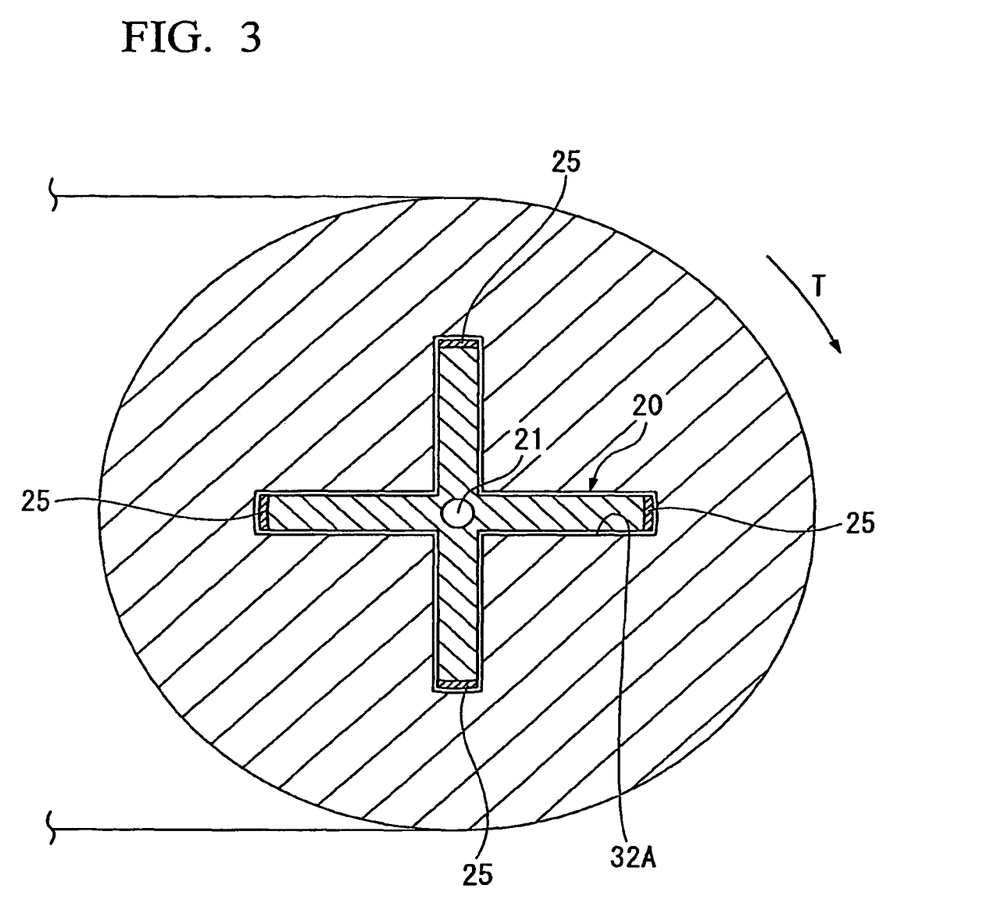
FIG. 3 is an A-A sectional view in FIG. 1.
Figure 4:
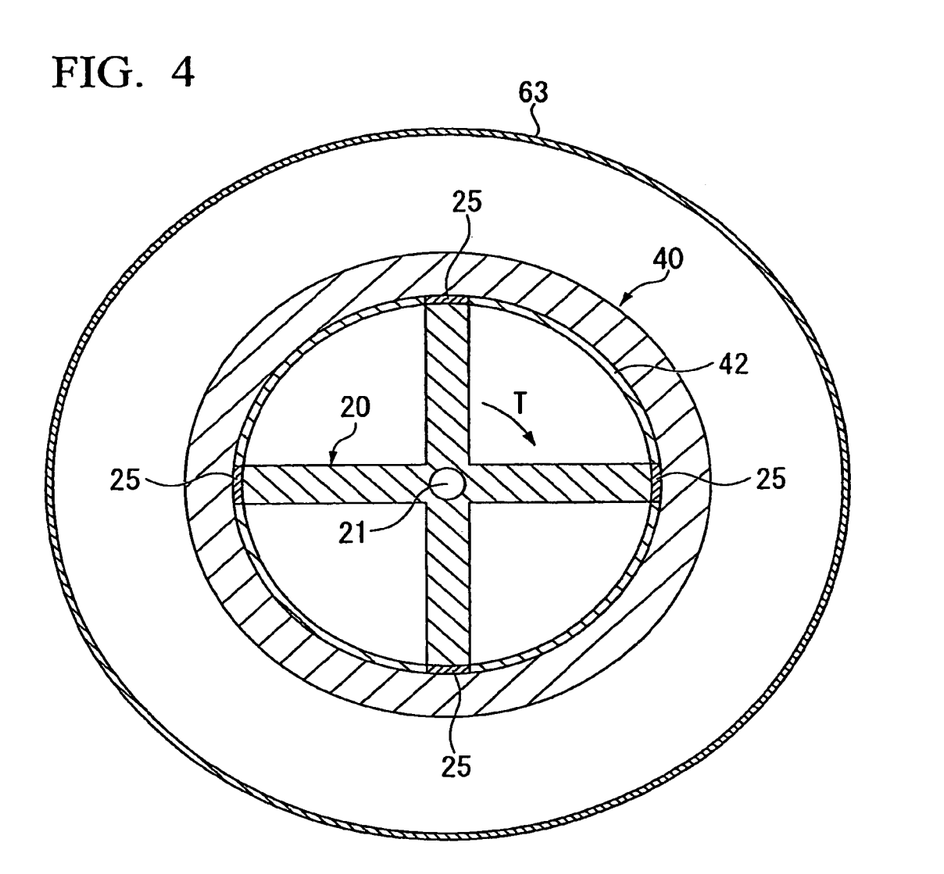
FIG. 4 is a B-B sectional view in FIG. 1.
Figure 5:
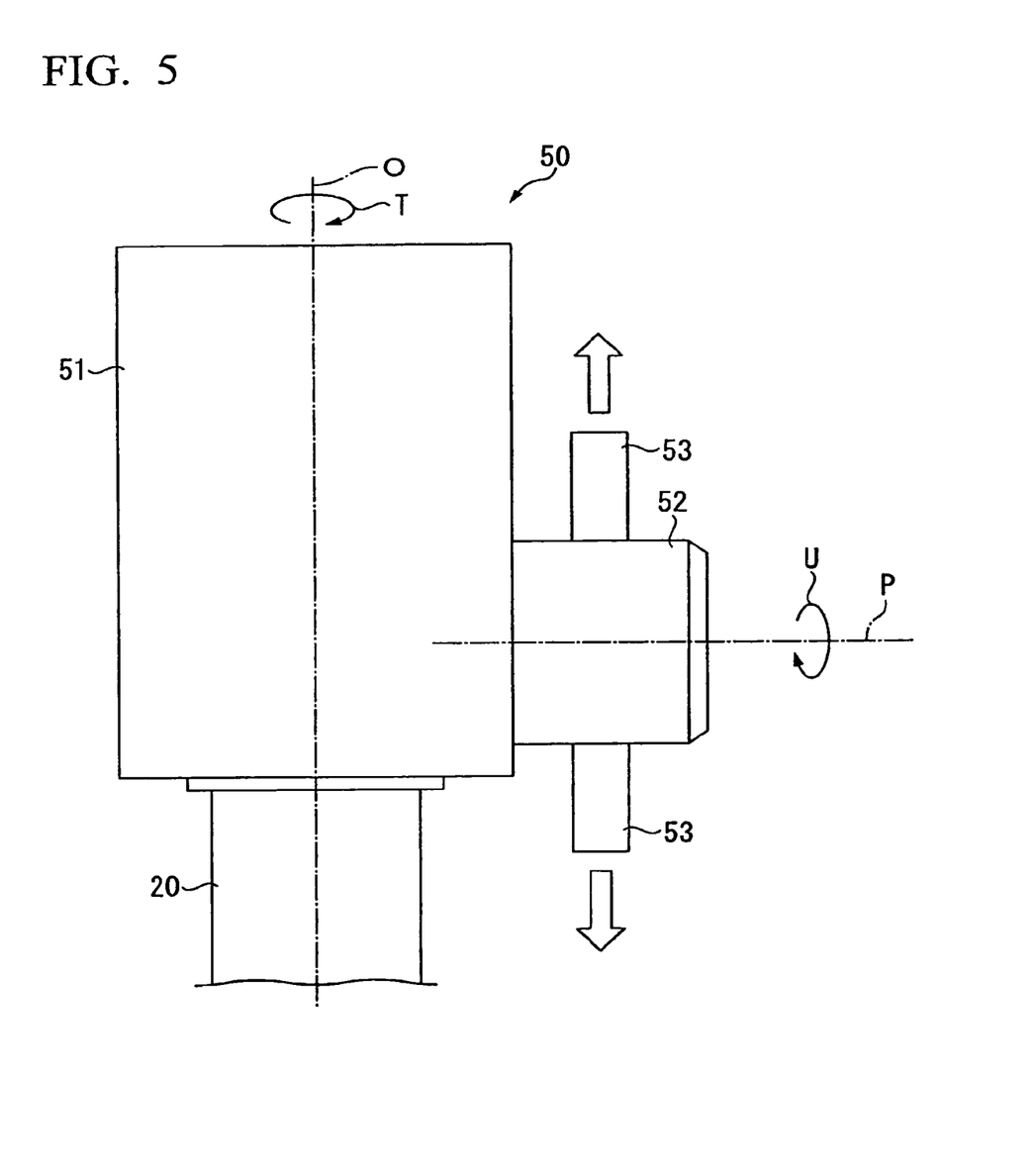
FIG. 5 is an enlarged view of a nozzle device of the reactor cleaning apparatus related to this embodiment.

Hereinafter, a reactor cleaning apparatus that is an embodiment of the invention will be described in detail with reference to the drawings. FIG. 1 is a schematic configuration diagram of a reactor cleaning apparatus related to this embodiment, FIG. 2 is a plan view of a tray of the reactor cleaning apparatus related to this embodiment, FIG. 3 is an A-A sectional view in FIG. 1, FIG. 4 is a B-B sectional view in FIG. 1, and FIG. 5 is an enlarged view of a nozzle device of the reactor cleaning apparatus related to this embodiment. As shown in FIG. 1, the reactor cleaning apparatus 1 related to this embodiment generally includes a tray 10, a shaft 20, a drive mechanism 30, a fixed nut 40, and a nozzle device 50.

The tray 10 has a substantially disc-like shape, and is placed such that a bottom surface of an outer peripheral portion of the tray 10 is supported by a strut 61 suitably erected on a floor portion 60. As shown in FIG. 2, a through hole 11 is provided at a central portion of the tray 10 in plan view so as to penetrate the tray in a vertical direction, and a cleaning water discharge hole 12 is provided in middle position of radial direction of the tray 10. The upper surface 10a of the tray 10 is formed in an inclined manner so as to have a descending gradient toward the cleaning water discharge hole 12.

Additionally, a rubber packing 71 abuts is provided on as an outer peripheral portion of the tray 10 (a flange portion 13). This rubber packing 71 is contacts at the lower opening edge of a bell jar of a reactor 70 to be cleaned. The bell jar 70 is firmly fixed on the tray 10 as, for example, bolting or the like is performed by a plurality of (twelve in this embodiment) detent portions 13a provided at intervals in the flange portion 13.

Additionally, as shown in FIG. 1, the hanging bell-shaped bell jar 70 has a dual structure which consists of outer wall 70A and inner wall 70B, and the inside of the reactor is hollowed. Thus, steam is supplied into the dual structure of the bell jar 70 of the reactor via a steam supply channel 63 from steam piping 62 provided annularly around the strut 61.

The shaft 20 extends along a vertical axis O so as to pass through the floor portion 60 and pass through the through hole 11 of the above-mentioned tray 10, and is provided so as to be rotatable around the vertical axis O. Additionally, a cleaning water supply channel 21 is pierced along the vertical axis O in the shaft 20. Thus, a cleaning water for cleaning an inner wall surface 72 of the bell jar 70 is supplied to the cleaning water supply channel 21 from a cleaning water supply pipe 23 connected to a cleaning water supply source (not shown) via a rotary joint 22 placed at a lower end portion of the shaft 20. Purified water or ultrapure water is used as the cleaning water.

Moreover, a feed screw 25 is formed at an outer peripheral portion of the shaft 20 which is notched in an L shape along the vertical axis O such that four spots of the outer peripheral surface thereof formed with the feed screw 25 form spline ridge and which is formed in a cross shape in a horizontal cross-section as shown in FIG. 3. Accordingly, the feed screw 25 is arranged only at the ends of the cross in the horizontal cross-section of the shaft 20.

The drive mechanism 30 includes a power source 31 composed of a motor, a reducer, etc; a pulley 32 having a disc shape; and a transmission belt 33 which transmits the rotation of the power source 31 to the pulley 32. Additionally, as shown in FIG. 3, a cross-shaped hole 32a which has a cross shape in plan view is opened in the middle of the pulley 32 as a spline groove. The outer peripheral surface of the above-mentioned shaft 20 fits into the cross-shaped hole 32a, and the rotation of the pulley 32 is transmitted to the shaft 20.

In addition, the cross-shaped hole 32a of the pulley 32 and the shaft 20 are fitted to each other so as to be slidable in the vertical direction. Accordingly, while the rotation of the pulley 32 is transmitted to the shaft 20, the shaft 20 is adapted to be able to move in the vertical direction with respect to the pulley 32.

The fixed nut 40 is a member which has a cylindrical shape and is fixed in accordance with the tray 12 onto a fixed base 41 provided below the tray 10 so as to pass through the through hole 11 of the tray 10. The inside of the fixed nut is formed with an internal thread 42 which extends along the vertical axis O. As shown in FIG. 4, the feed screw 25 of the shaft 20 is screwed to the internal thread 42 of the fixed nut 40, and the shaft 20 rotated in the direction of arrow T by the drive mechanism 30 moves upward such that the feed screw 25 is guided by the internal thread 42 of the fixed nut 40. On the other hand, when the shaft 20 is rotated in a direction opposite to the direction of arrow T, it moves downward. Additionally, bellows 64 which extend to vertical direction is provided at an outer periphery of the fixed nut 40 so as to surround the fixed nut 40 and the shaft 20 and to seal the through-hole 11. In accordance with the up-down movement of the shaft 20, the bellows 64 is also expanded and contracted so as to surround the shaft 20 constantly.

The nozzle device 50 is provided at an upper end of the shaft 20. The nozzle device is supplied with cleaning water from the cleaning water supply channel 21 of the shaft 20, and sprays the cleaning water at high pressure while being rotated in these directions. Specifically, as shown in FIG. 5, while a rotary housing 52 provided so as to protrude in the horizontal direction from the nozzle device body 51 is rotated in the direction of arrow U around a horizontal axis P, a nozzle device body 51 is rotated around the vertical axis O. This makes it possible to spray the cleaning water three-dimensionally in various directions from two nozzles 53 disposed on the rotary housing 52 at intervals of 180° so as to face a direction vertical to the horizontal axis P.

In addition, the driving of the nozzle device body 51 can have various methods. The cleaning water supplied from the cleaning water supply channel 21 turns, for example, an impeller (not shown) which is provided in the nozzle device body 51, the rotary housing 52 is rotated in the direction of arrow U around the horizontal axis P by the torque thereof. The nozzle device body 51 may be rotated in the direction of arrow T around the vertical axis O over a gear (not shown) by the torque thereof.

With the reactor cleaning apparatus 1 constructed as above, when the inner wall surface 72 of the reactor 70 is cleaned, the rubber packing 71 abuts is provided on as an outer peripheral portion of the tray 10 (a flange portion 13). The rubber packing 71 is contacts at the lower opening edge of a bell jar of a reactor 70. In addition, drains pipes 65 are connected to a drainage hole 12. Then, the shaft 20 rotated in the direction of T around the vertical axis O by the drive mechanism 30 is guided and moved upward by the fixed nut 40. Thereby, the nozzle device 50 attached the shaft 20 also moves upward as the rotation in the direction T around the vertical axis O in a state where the nozzle device faces the inner wall surface 72 of the reactor 70 placed above the tray 10.

Further, when the cleaning water is jetted, the nozzle device 50 rotates in the direction of T around the vertical axis O. In addition to this, the rotary housing 52 is rotated in the direction U around the horizontal axis P to spray the cleaning water at high pressure in the direction vertical to the horizontal axis P from the nozzles 53 provided in the rotary housing 52. On the other hand, when the drive mechanism 30 rotates the shaft 20 in the direction opposite to the direction T around the vertical axis O, the shaft 20 moves downward. With this downward movement, the nozzle device 50 moves downward while spraying the cleaning water as mentioned above. Since this makes it possible to spray the cleaning water at high pressure three-dimensionally in various directions from an upper portion of the inner wall surface 72 of the bell jar 70 to a lower portion thereof, it becomes possible to directly spray the cleaning water uniformly throughout an inner wall surface 72 of the reactor 70. This injection pressure of the cleaning water is from 10 MPa to 25 MPa. This range of the injection pressure is capable of easily and reliably removing the deposits of the inner wall surface 72 of the reactor 70.

At this time, steam is supplied into the dual structure of the bell jar of the bell jar 70. Thus, a cleaning water component which remains inside the bell jar 70 after spraying can be evaporated and removed reliably and efficiently, and the inside of the bell jar 70 can be kept at a cleaning level where high-quality polycrystalline silicon can be produced.

Additionally, the outer peripheral portion of the shaft 20 is notched along the vertical axis O so as to leave the feed screw 25 in a portion thereof, and the notched portion is formed in a cross shape in cross section, and the shaft 20 fits into the cross-shaped hole 32a of the pulley 32. Therefore, when the rotation of the power source 31 is transmitted to the pulley 32 by the transmission belt 33, the shaft 20 which fits to the pulley 32 is also rotated. At this time, since the shaft 20 fits the pulley 32 so as to be slidable in the vertical direction, the shaft 20 is rotated reliably without obstructing the transmission of power from the pulley 32 to the shaft 20 even if the feed screw 25 of the shaft 20 is guided by the fixed nut 40 and the shaft 20 moves up and down. Accordingly, since the shaft 20 can be moved up and down while a rotative force is reliably transmitted to the shaft, the nozzle device 50 provided at the upper end of the shaft 20 is able to spray the cleaning water effectively over the upper and lower portions of the inner wall surface 72 of the reactor 70.

Additionally, since the upper surface 10a of the tray 10 is inclined so as to have a descending gradient toward the discharge hole 12, the cleaning water which has been sprayed to the inner wall surface 72 of the bell jar 70 and is accommodated in the tray 10 is easily guided to the discharge hole 12. Therefore, the cleaning water can be easily removed after cleaning.

Additionally, since the cleaning water is used, this makes it possible to progress hydrolysis of the deposits and to remove as chemically stable silica. If there are slightly residues on such as the bell jar 70, it is harmless silica, and safe.

In addition, although corrosive gas, such as hydrogen chloride, is generated during cleaning, the space inside the bell jar 70 is in a substantially sealed state except for the discharge hole 12, and the corrosive gas is all discharged to the outside of the system through the drains pipes 65 from the discharge hole 12. Accordingly, the deterioration of the external atmosphere by the hydrogen chloride can be prevented from, and the working environment for producing high-quality polycrystalline silicon can be maintained.

Although the reactor cleaning apparatus 1 that is the embodiment of the invention has been described hitherto, the invention is not limited thereto, and can be suitably changed without departing from the technical idea of the invention.

For example, in this embodiment, as the spline ridge of the outer peripheral portion of the shaft 20, the outer peripheral portion is notched in an L shape along the vertical axis O such that four spots of the outer peripheral surface thereof form spline ridge, and is formed in a cross shape in a horizontal cross-section. However, the shape of the outer peripheral portion of the shape is not limited to the cross shape so long as the spline ridge are formed in the length direction of the shaft 20.

Figure 6:
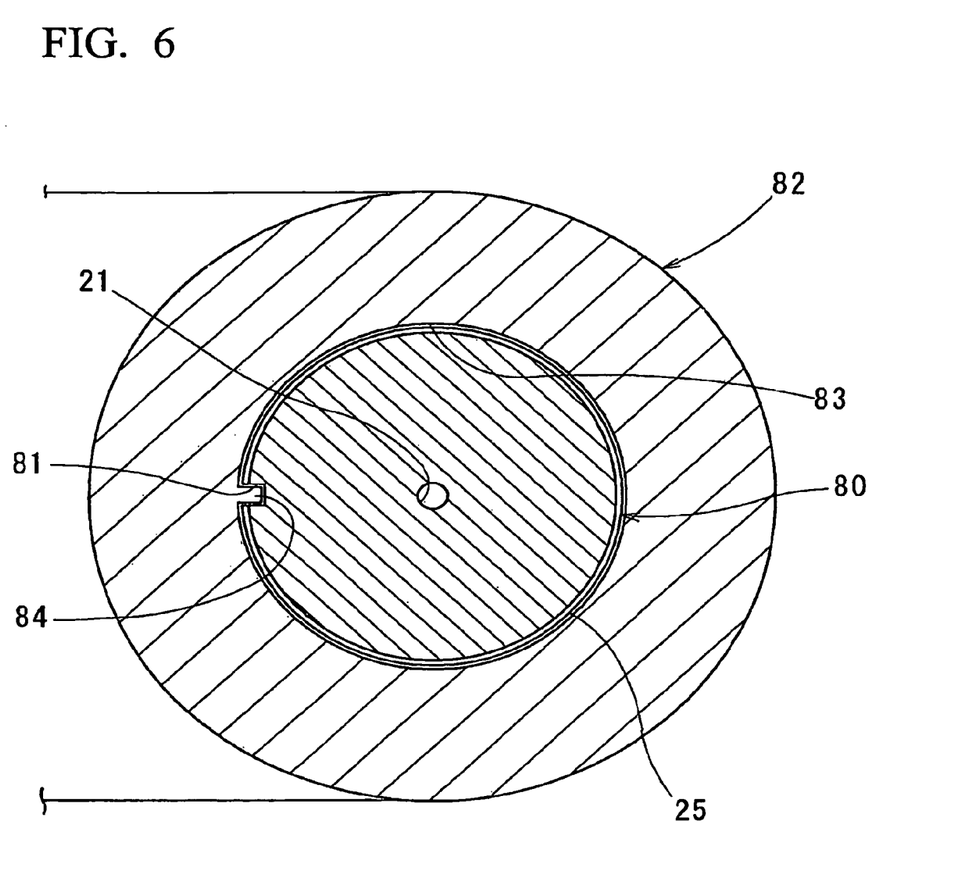
FIG. 6 is an A-A sectional view of a deformation example of a spline joint portion of pulley and shaft in FIG. 1.

For example, it may be the embodiment indicated in FIG. 6. As shown in FIG. 6, the shaft 80 has a cylindrically shape, one of the spline groove 81 are formed in the length direction of the shaft 80 in a portion of the outer peripheral portion thereof, the pulley 82 is formed with spline ridge 84 fit the spline groove 81 in the inner peripheral portion of the circular hole 83 which is fully inserted the shaft 80. The spline groove and spline ridge may be provided to fit between the shaft and the pulley.

Additionally, the feed screw 25 and spline ridge of the shaft 20 may be formed independently from each other. That is, in this embodiment, the shaft 20 is formed in a cross shape in cross-section as the spline ridge, and the feed screw 25 is formed at ends of the cross. However, in the shaft 20, the spot where spline ridge are formed and the spot where the feed screw 25 is formed may be separated.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for cleaning a bell jar reactor used for producing polycrystalline silicon in a Siemens method, having a separate inner wall and an outer wall structure, which generates polycrystalline silicon, the method comprising the steps of:

providing a lower opening edge of the bell jar on a substantially disc-shaped tray;

providing a shaft in a central portion of the tray in the vertical direction and a power source that is capable of rotating the shaft in clockwise and anti-clockwise direction around an axis of the shaft;

fixing the lower opening edge of the bell jar reactor on the substantially disc-shaped tray;

rotating the shaft clockwise and anti-clockwise with the power source;

supplying a cleaning water to a nozzle device provided at an upper end of the shaft to spray the cleaning water to an inner peripheral surface of the bell jar at high pressure in three-dimensional directions with the nozzle device;

draining a wasted cleaning water including a corrosive gas from a drainage hole formed in the tray;

supplying steam between an outer wall and an inner wall of the bell jar; and drying the inner peripheral surface of the bell jar, wherein a feed screw is formed on an outer peripheral portion of the shaft, the tray is provided with a fixed nut which is screwed to the feed screw and guides the shaft upward and downward in accordance with rotation of the shaft, the nozzle device is rotated when the nozzle device is moving vertically upward and downward, a rotary housing, which protrudes horizontally from the nozzle device, rotates around an axis perpendicular to an axis of rotation of the nozzle device when the nozzle device is moving vertically, and the cleaning water is sprayed from a nozzle provided on an outer circumference of the rotary housing in a direction perpendicular to the rotating axis of the rotary housing, and wherein the shaft is rotated in one direction when the shaft is moving vertically upward and the shaft is rotated in an opposite direction when the shaft is moving vertically downward, and wherein the rotary housing is rotated by physical force obtained from the cleaning water running through the nozzle device.

2. The method for cleaning the bell jar reactor of claim 1, wherein the cleaning water is sprayed from a location in a lower portion of the reactor to a location in an upper portion of the rector.

3. The method for cleaning the bell jar reactor of claim 1, wherein the cleaning water is sprayed from a location in an upper portion of the reactor to a location in a lower portion of the reactor.

4. The method for cleaning the bell jar reactor of claim 1, wherein the cleaning water is sprayed from a location in a lower portion of the reactor to a location in an upper portion of the reactor and is sprayed from a location in an upper portion of the reactor to a location in a lower portion of the reactor.

5. The method for cleaning the bell jar reactor of claim 1, wherein an injection pressure of the cleaning water is 10 MPa to 25 MPa.

6. A method for cleaning an inner wall surface of a reactor which generates polycrystalline silicon using a Siemens method, a bell jar of the reactor having a dual structure, the method comprising the steps of:

providing a lower opening edge of the bell jar on a substantially disc-shaped tray;

providing a shaft in a central portion of the tray in the vertical direction and a power source that is capable of rotating the shaft in clockwise and anti-clockwise direction around an axis of the shaft;

fixing the lower opening edge of the bell jar reactor on the substantially disc-shaped tray;

rotating the shaft clockwise and anti-clockwise with the power source;

supplying a cleaning water to a nozzle device provided at an upper end of the shaft to spray the cleaning water to an inner peripheral surface of the bell jar at high pressure in three-dimensional directions with the nozzle device;

draining a wasted cleaning water including a corrosive gas from a drainage hole formed in the tray; and drying the inner peripheral surface of the bell jar, wherein a feed screw is formed on an outer peripheral portion of the shaft, the tray is provided with a fixed nut which is screwed to the feed screw and guides the shaft upward and downward in accordance with rotation of the shaft, the nozzle device is rotated when the nozzle device is moving vertically upward and downward, a rotary housing, which protrudes horizontally from the nozzle device, rotates around an axis perpendicular to an axis of rotation of the nozzle device when the nozzle device is moving vertically, and the cleaning water is sprayed from a nozzle provided on an outer circumference of the rotary housing in a direction perpendicular to the rotating axis of the rotary housing, and wherein the shaft is rotated in one direction when the shaft is moving vertically upward and the shaft is rotated in an opposite direction when the shaft is moving vertically downward, and wherein the rotary housing is rotated by physical force obtained from the cleaning water running through the nozzle device.

7. The method for cleaning the inner wall surface of the reactor of claim 6, wherein the cleaning water is sprayed from a location in a lower portion of the reactor to a location in an upper portion of the reactor.

8. The method for cleaning the inner wall surface of the reactor of claim 6, wherein the cleaning water is sprayed from a location in an upper portion of the reactor to a location in a lower portion of the reactor.

9. The method for cleaning the inner wall surface of the reactor of claim 6, wherein the cleaning water is sprayed from a location in a lower portion of the reactor to a location in an upper portion of the reactor and is sprayed from a location in an upper portion of the reactor to a location in a lower portion of the reactor.

10. The method for cleaning the inner wall surface of the reactor of claim 6, wherein an injection pressure of the cleaning water is 10 MPa to 25 MPa.

\* \* \* \* \*